United States Patent [19]
Cenedella et al.

[11] Patent Number: 5,853,882
[45] Date of Patent: Dec. 29, 1998

[54] COMPOSITIVE PREPREG PLY HAVING TAILORED ELECTRICAL PROPERTIES AND METHOD OF FABRICATION THEREOF

[75] Inventors: Anne E. Cenedella, University City; Richard E. Sharp, Weldon Springs, both of Mo.

[73] Assignee: McDonnell Douglas Corporation, St. Louis, Mo.

[21] Appl. No.: 917,484

[22] Filed: Aug. 26, 1997

[51] Int. Cl.$^6$ ................................ B32B 15/00; B32B 4/00
[52] U.S. Cl. ................. 428/379; 428/297.4; 428/300.1; 428/323; 428/408; 428/361; 428/375; 428/388; 428/389; 428/394; 156/272.2; 156/275.3; 427/126.1; 427/304; 427/322; 427/430.1
[58] Field of Search ............................... 428/297.4, 300.1, 428/323, 408, 361, 375, 379, 388, 389, 394; 156/272.2, 275.3; 427/126.1, 304, 322, 430.1

[56] References Cited

U.S. PATENT DOCUMENTS

| | | |
|---|---|---|
| 4,364,739 | 12/1982 | Tomibe et al. . |
| 4,374,893 | 2/1983 | Arsac et al. . |
| 4,661,376 | 4/1987 | Liang . |
| 4,759,986 | 7/1988 | Marikar et al. . |
| 4,892,626 | 1/1990 | Covey . |
| 5,089,325 | 2/1992 | Covey . |

OTHER PUBLICATIONS

Patterned Fibers, Glen L. Rasmussen, filed Dec. 18, 1996.
New Microwave Absorber Using Resistive Cloth, Ichihara et al, Tokyo Inst. Of Tech.
J. Chem. Soc. (A), 1970, The Electronic Properties and Crystal structure of $Na_4Cu(NH_3)_4$–$[Cu(S_2O_3)_2]_2$ $L(L=H_2O$ or $NH_3)$.
Properties Of Thin Films For Solar Cells, Sec. 6.2, Chapter 6, pp. 310–316.

*Primary Examiner*—Richard Weisberger
*Attorney, Agent, or Firm*—Westerlund Powell, P.C.; Robert A. Westerlund

[57] ABSTRACT

An composite prepreg ply which can be designed to exhibit desired electrical properties without loss of structural integrity or the addition of parasitic weight, and a method of preparing the composite prepreg ply. The composite prepreg ply includes: (i) a low dielectric cloth substrate having a metal layer adherent on both sides thereon, the metal having been selectively removed from at least one portion of at least one side of the cloth, such that there is at least one area of cloth without any metal adherent thereon; (ii) a layer of encapsulant resin material adherent on the metal layer; (iii) a resistive resin layer containing a filler material dispersed in a carrier resin, the resistive resin layer adherent on desired areas the cloth without any metal adherent thereon, and (iv) an impregnating resin covering one or both outermost surfaces of the encapsulant resin material and the resistive resin layer.

30 Claims, No Drawings

COMPOSITIVE PREPREG PLY HAVING TAILORED ELECTRICAL PROPERTIES AND METHOD OF FABRICATION THEREOF

BACKGROUND OF THE INVENTION

The present invention relates to an improved composite prepreg ply which can be designed to exhibit desired electrical properties without loss of structural integrity or the addition of parasitic weight, and a method of preparing the improved composite prepreg ply.

Articles fabricated from fiber reinforced resin matrix composite materials are known, and have found increasing use in load bearing structural applications due to their high strength, light weight, and ability to be fashioned into complex shapes. Such composite structural materials are particularly suitable for aircraft structures.

In many aerospace and electronics applications, including EMI shielding/attenuation, antennas, aircraft structures components and anechoic chambers, it is desirable to impart certain electrical properties to the composite structure. One method to impart the electrical properties to the composite structure is to incorporate a secondary material. For example, resistive films are known which are designed to provide nearly constant resistance with frequency and to exhibit very little capacitive reactance. Such films comprise a resistive ink sprayed or screen printed upon a substrate such as a polyimide or polyester film. The resistive ink can be a phenolic resin filled with carbon and/or silver. However, incorporating a second material into a composite structural material suffers from several disadvantages, including the addition of parasitic weight, secondary processing complications, increased layup costs due to the inclusion of the second material, and disruption of structural ply continuity within the structure. In particular, the polyester and polyimide substrates tend to act as a release film rather than as an adhesive layer.

An object of the present invention is to provide a method for imparting the desired electrical properties to the composite structure by incorporating a prepegged structural ply. This ply may be comprised of the same fabric and weave style and prepeg resin as the conventional plies in the composite structure, thereby, in effect, replacing one conventional ply. This method adds no additional weight, allows the composite structure to be processed conventionally, and provides structural continuity. The present invention is fashioned to allow the electrical properties of this ply to remain stable after processing at the elevated temperatures and pressure conditions associated with autoclave curing, which can generally distort or even destroy the electrical properties of lesser materials. Another object of the present invention is to provide an improved composite material which exhibits the structural integrity of conventional composite materials and yet also has electrical properties tailored to specific applications.

SUMMARY OF THE INVENTION

In one aspect, the invention relates to a composite prepreg ply comprising:
(i) a low dielectric cloth substrate having a metal layer adherent on both sides thereon, the metal having been selectively removed from at least one portion of at least one side of the cloth, such that there is at least one area of cloth without any metal adherent thereon;
(ii) a layer of encapsulant resin material adherent on the metal layer;
(iii) a resistive resin layer comprising a filler material dispersed in a carrier resin, the resistive resin layer adherent on desired areas of the cloth without any metal adherent thereon, and
(iv) an impregnating resin covering outermost surfaces of the encapsulant resin material and the resistive resin layer.

In a second aspect, the invention relates to a method for fabricating a composite prepreg ply, comprising:
i) depositing a layer of metal on a low dielectric cloth by electroless plating, thereby producing a plated cloth having a metal layer;
ii) selectively coating at least one portion of the metal layer with an encapsulant composition to produce a plated cloth having a metal layer with at least one encapsulated area and one non-encapsulated area;
iii) selectively removing each non-encapsulated area of the metal layer by acid etching to produce at least one unplated area of the cloth;
iv) applying a resistive coating comprising a filler material dispersed in a carrier resin to desired unplated areas of the cloth; and
v) impregnating one or both sides of the cloth with an impregnating composition.

DETAILED DESCRIPTION OF THE INVENTION

The inventors have discovered that desirable electrical properties can be incorporated into a composite prepreg ply without loss of structural integrity or the addition of parasitic weight. This is achieved by encapsulating a metal layer deposited on the cloth substrate of the prepreg with an encapsulant resin, and by the addition of a resistive resin to desired areas of the cloth whose metal layer has been selectively removed.

The cloth suitable for use in the present invention may be any low dielectric unidirectional tape, woven cloth or nonwoven fabric of interbonding fibers. Suitable low dielectric fibers include high strength fibers such as fiberglass fibers, ceramic fibers and aramid fibers, which are commercially available. For example, S-2 fiberglass woven or nonwoven cloth is commercially available from Owens/Corning Fiberglass Corporation, Toledo, Ohio. Kevlar aramid fiber and woven and nonwoven cloth are available from E. I. du Pont de Nemours & Co., Wilmington, Del. Ceramic fibers include quartz fibers. Carbon cloth is too conductive to be used in this invention.

The cloth may have a weight range of from 0.5 to 15 oz/square yard, preferably 1.4 to 9 oz/square yard. Suitable weaves include plain weaves, such as Mil. Std. (MIL-Y-1140) Style 1000 and 2116, and satin weaves such as Mil. Std. (MIL-Y-1140) Style 16781. An anisotropic wave pattern (i.e., Mil Std. (MIL-Y-1140) Style 16781 8 Harness satin weave) will produce directional electrical properties.

The weight and weave of the cloth can be used to tailor the electrical properties of the structural composite. More particularly, the weave pattern affects both resistance and reactance, while cloth thickness affects reactance.

Both sides of the cloth are coated with a layer of metal by a conventional electroless plating method well known to those of ordinary skill in the art. The metal may be selected from nickel, platinum, gold, cobalt and copper, and their alloys. The resulting metal layer provides electrical "reactance" (capacitive opposition to flow of ac current) to the cloth.

Areas of the plated cloth which are to be subsequently acid etched are first masked to prevent overspray. The masked plated cloth is then selectively coated on one or both sides with an encapsulant formulation over the exposed (unmasked) areas which are to remain plated.

The primary function of the encapsulant is to protect selected metal/cloth areas from subsequent autoclave processing, with a secondary function being to protect against acid etching. The encapsulant composition should be chosen to provide the best combination of drape/handleability and protection of electrical properties. The encapsulant should possess a low dielectric constant (with the exception of elastomeric encapsulatants) and generally a glass transition temperature ($T_g$) which is higher than the temperatures encountered during normal use.

Illustrative encapsulants include epoxy resins, polyimide resins, bismaleimide resins, cyanate ester resins, phenolics, elastomers and thermoplastics. A solvent such as methyl ethyl ketone may be used to thin the resin to a viscosity suitable for spray coating. A typical resin content for the encapsulant composition is 5–10 weight percent.

An illustrative example of an epoxy encapsulant composition is set forth below:

| | |
|---|---|
| Diglycidal Ether Bisphenol A Epoxy resin (EEW[1] = 450-550) | 150 g |
| Methyl Ethyl Ketone | 1000 g |
| Imidazole | 5 g |

[1]EEW = Epoxide Equivalent Weight

Cyanate ester resin encapsulant formulations are also preferred. An illustrative example of a cyanate ester resin encapsulant is set forth below:

| | |
|---|---|
| Polycyanurate resin - 50% Polymerized (CEW[2] = 278) | 410 g |
| Cobalt acetylacetonate | 1 g |
| Dinonylphenol | 8 g |
| Methyl ethyl ketone | 260 g |

[2]CEW = Eyanate Equivalent Weight

The encapsulant composition may be sprayed onto the cloth, with robotic spray application being preferred.

The sprayed encapsulant composition is then cured, assuming that it is a thermoset rather than a thermoplastic. The temperature and time required for cure will depend on the chemical nature of the encapsulant composition, and can be readily determined by trial and error. For the preferred epoxy resin encapsulant composition set forth above, cure is achieved at 350° F. (177° C.) for one hour. The resulting encapsulant layer has a thickness of a few microns, is a solid at room temperature, and encapsulates only the surface fibers of the cloth.

A protective paste may be applied to the circumference of those areas of the cloth which are to be removed by acid etching. The paste serves to neutralize the acid etchant, and may be painted on the cloth using a fine paintbrush. Other application methods include spraying or roll application.

Any composition which is effective to neutralize the acid etchant, which can be easily removed, which has a suitable thixotropic (paste) consistency, and which is otherwise compatible with the cloth and its coatings may be used in the practice of this invention. An illustrative paste composition comprises sodium bicarbonate dispersed in polyvinyl alcohol.

The plated cloth is then acid etched to selectively remove portions of the metal layer where electrical "windows" are desired. The method of application of the acid etchant to the metal layer is not critical. For example, the acid etchant may be locally applied by pipette to the center of the desired area(s) and worked outward to the area boundaries, which are lined by the protective paste.

The acid etchant may be any acidic solution which will remove non-encapsulated areas of the metal layer in a reasonable time without significantly degrading the cloth itself. Inorganic acids in aqueous solutions, such as nitric acid, sulfuric acid and hydrochloric acid, may be useful in the practice of this invention. The acid etchant is permitted to stand for a time sufficient to remove the metal layer. The standing period will be determined by the type of metal and the acid etchant employed to remove it. A typical standing period is 5 to 45 minutes.

The acid, dissolved metal and the protective paste are removed by rinsing with deionized water. The etched cloth is then dried. A typical drying period is one hour at 150° F. (66° C.).

Alternative acid etchant application techniques include spraying and immersion. Other acid etchants, such as weak inorganic acids and organic acids, may have utility in the practice of this invention. One possible complication with weak acids is the formation of salts which could be detrimental to the cloth's ultimate electrical properties. Those of ordinary skill in the art can easily determine the suitability of a particular acid by trial and error.

A resistive coating is typically applied to desired areas of the cloth substrate which have been exposed by removal of the metal layer by the acid etchant solution. The resistive coating comprises a filler material dispersed in a carrier resin, and is formulated to provide good handling characteristics (i.e. drape) while maintaining resistance to electrical property changes during autoclave curing.

The filler material should be either electrically conductive or semi-conductive. Illustrative filler materials include carbon (including blacks and graphites) powders, nickel powders, silver, metallic coated spheres, conductive polymers and their blends. A mixture of carbon powders having different average particle sizes (e.g., 0.3 micron, 2 micron and 44 micron) is an effective filler material.

Suitable carrier resins include cyanate ester, epoxy, epoxy blends, phenolics, polyimides, bismaleimides, thermoplastic resins such as nylon, polyester, polyetheretherketone and polyetherimide and elastomeric resins such as polyurethane, silicone, polysulfone and polysulfide. Many of these resins are commercially available. The resistive coating can be applied by spray coating, although other conventional application techniques can be used, such as screen printing, roller coating and doctor blade application. A mask may be used to protect the encapsulated cloth from overspray of the resistive coating.

Illustrative examples of epoxy and cyanate ester resistive coatings are set forth below:

1. Epoxy Resistive Coating Composition

| | |
|---|---|
| Diglycidal Ether Bisphenol A Epoxy Resin (EEW[3] = 450–550) | 320 g |
| Diglycidal Bther Bisphenol A Epoxy Resin (EEW[3] = 200–250) | 320 g |
| 44 Micron Graphite Powder | 125 g |
| 2 Micron Graphite Powder | 313 g |

-continued

| | |
|---|---|
| 0.3 Micron Carbon Black | 62 g |
| Imidazole | 21 g |
| Methyl Ethyl Ketone | 1450 g |
| Methyl Isobutyl Ketone | 1450 g |
| 2. Cyanate Ester Resistive Coating Composition | |
| Polycyanurate Resin - 50% Polymerized (CEW[4] = 278) | 440 g |
| 44 Micron Graphite Powder | 160 g |
| 2 Micron Graphite Powder | 400 g |
| 0.3 Micron Carbon Black | 80 g |
| Cobalt Acetylacetonate | 1 g |
| Dinonylphenol | 9 g |
| Methyl Ethyl Ketone | 2500 g |
| Methyl Isobutyl Ketone | 2500 g |

[3]EEW = Epoxide Equivalent Weight
[4]CEW = Cyanate Equivalent Weight

The above compositions may be prepared by mixing the resins, carbon fillers and solvents to achieve a uniform dispersion. Addition of the curing agent may be deferred until just prior to application in order to avoid stability problems.

A thermoplastic resistive coating does not require cure. Thermosetting resistive coatings are typically cured at elevated temperatures over an extended time period, with specific times and temperatures suitable to the particular resin chemistry. For example, an epoxy coating may be cured at 350° F. (177° C.) for four hours.

The cured cloth is subsequently fabricated into a prepreg ply by spray coating one or both sides of the cloth with an impregnating resin composition, which will usually include reactive resin components, curing agents and at least one organic solvent. Typical resins include epoxy, epoxy novolacs and other thermosetting resins including polyesters, polyimides (both condensation and addition types), phenolic resins and bismaleimides. The resin may contain a thermoplastic or elastomeric agent to increase fracture resistance. A preferred epoxy impregnating resin is Fiberite 977-3, which is available from Hexcel Corporation, Pleasanton, Calif. 94588. An illustrative resin impregnating system comprises 100 parts Epon 828 (difunctional Bisphenol A/epichlorohydrin) liquid epoxy resin manufactured by Shell Chemical Co. and 20 parts DDS (diaminodiphenyl sulfone) as an accelerator, dissolved in a solvent system comprising 50 parts MEK (methyl ethyl ketone), and 50 parts MIBK (methyl isobutyl ketone).

The impregnating resin composition is applied to the cloth until the resin accounts for approximately 2–50 weight percent of the total weight of the impregnated cloth. The impregnated cloth may be dried at temperatures above ambient for a time sufficient to remove most of the solvent in the impregnating resin composition. Different resins may have different drying procedures depending on the solvent and resin concentration. Typical drying conditions are 10–45 minutes at 150° F. (66° C.) for a cloth impregnated with 35% epoxy resin by weight.

The resulting impregnated cloth is considered a B-staged ply, ready for assembly ("lay up") into a laminate to be cured into a structural composite material. The impregnated cloth may be packaged between diamond embossed polyethylene film and stored at 0° C. or below until layup.

The impregnated cloth of this invention, also known as a prepreg ply, may be incorporated into an otherwise conventional structural composite using conventional techniques. For example, at least one prepreg ply may be laid upon onto another prepreg ply, thereby obtaining a prepreg stack. The prepreg ply of this invention may be placed at any location in a multiple ply stack.

The prepreg stack may be cured by means of an autoclave at an elevated temperature and pressure. Cure conditions will depend on the impregnating resin employed. A typical autoclave temperature is 200° to 450° F. (93.3° to 232° C.), while a typical pressure can range from 50 to 200 psi, preferably from 30 to 100 psi. The time required for cure will depend on the size and shape of the composite material, the amount of impregnating resin contained in the plies, the number of plies of material, as well as the temperature and pressure conditions employed.

EXAMPLE 1

Composite prepreg plies were prepared by depositing nickel metal on both sides of S-2 fiberglass nonwoven cloth, commercially available from Owens/Corning Fiberglass Corporation, Toledo, Ohio, by an electroless coating process.

The inventive metal-coated cloth was mounted in a frame, and areas to be subsequently acid-etched were masked on one side of the cloth. The unmasked metal was robotically sprayed on both sides with the following epoxy resin encapsulant formulation:

| | |
|---|---|
| Diglycidal Ether Bisphenol A Epoxy resin (BBW[5] = 450–550) | 150 g |
| Methyl Ethyl Ketone | 1000 g |
| Imidazole | 5 g |

[5]EEW = Epoxide Equivalent Weight

The encapsulant was cured at 350° F. (177° C.) for sixty minutes. A protective basic paste (baking soda dispersed in polyvinyl alcohol) was painted on the edges of the cured encapsulant. Nitric acid was then applied at the center of the non-encapsulated areas and worked outward towards the painted edges of the cured encapsulant. The nitric acid was permitted to stand for thirty minutes, whereupon it was rinsed from the cloth with deionized water. The etched cloth was dried at 150° F. (66° C.) for one hour, and then mounted in a frame and masked to protect the encapsulated regions of the cloth.

An epoxy resistive composition was prepared having the following formulation:

| 1. Epoxy Resistive Coating Composition | |
|---|---|
| Diglycidal Bther Bisphenol A Epoxy Resin(BEW[6] = 450–550) | 320 g |
| Diglycidal Ether Bisphenol A Epoxy Resin (EBW[6] = 200–250) | 320 g |
| 44 Micron Graphite Powder | 125 g |
| 2 Micron Graphite Powder | 313 g |
| 0.3 Micron Carbon Black | 62 g |
| Imidazole | 21 g |
| Methyl Ethyl Ketone | 1450 g |
| Methyl Isobutyl Ketone | 1450 g |

[6]EEW = Epoxide Equivalent Weight

This formulation was prepared by first mixing the carbon powders, epoxy resins and solvents together by shaking for two hours and permitting the mixture to stand overnight. The imidazole curing agent was then added, together with additional solvent to achieve a desirable spray viscosity. The resulting formulation was sprayed onto the etched areas of the cloth, and cured at 350° F. (177° C.) for four hours.

The cured cloth was subsequently fabricated into a prepreg ply by mounting the cloth in a frame and spray coating both sides of the cloth with an epoxy impregnating resin system. The cloth was dried at 150° F. (66° C.) for one hour, packaged between diamond embossed polyethylene film, and stored in a freezer.

The stored composite plies were permitted to come to room temperature before the polyethylene film was opened. Several plies were consecutively indexed to a tool surface, with darting/splicing being performed as required. The plies were hot debulked to the tool surface, and cured at 355° F. (179° C.) and 80 psi to form composite stacks.

The composite prepreg ply of this invention offers several advantages in comparison to a composite structure formed of two or more materials. First, the present invention eliminates parasitic weight and secondary processing problems inherent in a multi-material approach. Second, structural integration of the desired electrical properties in a single ply results in a more supportable/maintainable structure. Third, lay-up costs are minimized by the use of a single material. Finally, the composite prepreg ply of this invention maintains the structural ply continuity of the article.

What is claimed is:

1. A composite prepreg ply comprising:
   (i) a low dielectric cloth substrate having a metal layer adherent on both sides thereon, the metal having been selectively removed from at least one portion of at least one side of said cloth, such that there is at least one area of cloth without any metal adherent thereon;
   (ii) a layer of encapsulant resin material adherent on the metal layer;
   (iii) a resistive resin layer comprising a filler material dispersed in a carrier resin, said resistive resin layer adherent on desired area of said cloth without any metal adherent thereon, and
   (iv) an impregnating resin covering outermost surfaces of said encapsulant resin material and said resistive resin layer.

2. The composite prepreg ply of claim 1, wherein said cloth is a member of the group consisting of fiberglass woven or nonwoven cloth, ceramic woven or nonwoven cloth, and aramid woven or nonwoven cloth.

3. The composite prepreg ply of claim 1, wherein said cloth has a weight range of from 0.5 to 15 oz/square yard.

4. The composite prepreg ply of claim 3, wherein said cloth has a weight range of from 1.4 to 9 oz/square yard.

5. The composite prepreg ply of claim 1, wherein said metal comprises at least one member selected from the group consisting of nickel, iron, platinum, copper, gold, cobalt and their alloys.

6. The composite prepreg ply of claim 1, wherein said encapsulant composition contains at least one member of the group consisting of a cyanate ester resin, an epoxy resin, a polyimide resin, a bismaleimide resin, a phenolic resin, an elastomeric resin and a thermoplastic resin.

7. The composite prepreg ply of claim 1, wherein said filler material of said resistive coating is at least one member of the group consisting of carbon powders, iron powders, nickel powders, silver, metallic coated spheres and conductive polymers.

8. The composite prepreg ply of claim 1, wherein said carrier resin of said resistive coating is at least one member of the group consisting of a cyanate ester resin, a polyimide resin, a bismaleimide resin, an epoxy resin, a phenolic resin, a thermoplastic resin and an elastomeric resin.

9. The composite prepreg ply of claim 8, wherein said elastomeric resin is selected from the group consisting of polysulfone resin, polysulfide resin, polyurethane resin and silicone resin.

10. The composite prepreg ply of claim 8, wherein said thermoplastic resin is selected from the group consisting of nylon, polyester, polyetheretherketone and polyetherimide.

11. The composite prepreg ply of claim 1, wherein said impregnating composition comprises at least one resin selected from the group consisting of an epoxy resin, an epoxy novolac, a thermoplastic resin, a polyimide resin, a phenolic resin, an elastomeric resin and a bismaleimide resin.

12. A method for fabricating a prepreg ply, comprising:
   i) depositing a layer of metal on a low dielectric cloth by electroless plating, thereby producing a plated cloth having a metal layer;
   ii) selectively coating at least one portion of the metal layer with an encapsulant composition to produce a plated cloth having a metal layer with at least one encapsulated area and one non-encapsulated area;
   iii) selectively removing each non-encapsulated area of the metal layer by acid etching to produce at least one unplated area of the cloth;
   iv) applying a resistive coating comprising a filler material dispersed in a carrier resin to each desired unplated area of the cloth; and
   v) impregnating one or both sides of the cloth with an impregnating composition.

13. The method of claim 12, wherein said cloth is a member of the group consisting of fiberglass woven or nonwoven cloth, ceramic woven or nonwoven cloth, and aramid woven or nonwoven cloth.

14. The method of claim 12, wherein said cloth has a weight range of from 0.5 to 15 oz/square yard.

15. The method of claim 14, wherein said cloth has a weight range of from 1.4 to 9 oz/square yard.

16. The method of claim 12, wherein said metal comprises at least one member selected from the group consisting of nickel, iron, platinum, gold, cobalt, copper and their alloys.

17. The method of claim 12, wherein said encapsulant composition contains at least one member of the group consisting of a cyanate ester resin, an epoxy resin, a polyimide resin, a bismaleimide resin, a phenolic resin, an elastomeric resin and a thermoplastic resin.

18. The method of claim 12, wherein said protective paste comprises a mixture of polyvinyl alcohol and sodium bicarbonate.

19. The method of claim 12, wherein the acid used to etch said reactive component comprises nitric acid.

20. The method of claim 12, wherein said filler material of said resistive coating is at least one member of the group consisting of carbon powders, nickel powders, silver, metallic coated spheres, and conductive polymers.

21. The method of claim 12, wherein said carrier resin of said resistive coating is at least one member of the group consisting of a cyanate ester resin, a polyimide resin, a bismaleimide resin, an epoxy resin, a phenolic resin, a thermoplastic resin and an elastomeric resin.

22. The method of claim 21, wherein said elastomeric resin is selected from the group consisting of polyurethane, polysulfone, polysulfide, and silicone.

23. The method of claim 21, wherein said thermoplastic resin is selected from the group consisting of nylon, polyester, polyetheretherketone and polyetherimide.

24. The method of claim 12, wherein said impregnating composition comprises at least one resin selected from the group consisting of an epoxy resin, an epoxy novolac, a thermoplastic resin, a polyimide resin, a phenolic resin, an elastomeric resin and a bismaleimide resin.

25. The method of claim 12, further comprising:

applying a protective paste to a circumference of each non-encapsulated area prior to acid etching.

26. A method of making a composite material, comprising i) placing at least one prepreg ply of claim 12 onto another prepreg cloth, thereby obtaining a prepreg stack;

ii) curing said prepreg stack by means of an autoclave at an elevated temperature and pressure.

27. The method of claim 26, wherein said elevated temperature is 93.3° to 232° C.

28. The method of claim 26, wherein said elevated pressure is 30 to 200 psi.

29. The method of claim 28, wherein said elevated pressure is 80 to 100 psi.

30. A composite material prepared by the method of claim 26.

* * * * *